(12) United States Patent
Park et al.

(10) Patent No.: US 7,990,765 B2
(45) Date of Patent: Aug. 2, 2011

(54) LEAST SIGNIFICANT BIT PAGE RECOVERY METHOD USED IN MULTI-LEVEL CELL FLASH MEMORY DEVICE

(75) Inventors: Kyung-min Park, Seoul (KR); Seong-jun Ahn, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 146 days.

(21) Appl. No.: 12/585,299

(22) Filed: Sep. 10, 2009

(65) Prior Publication Data

US 2010/0074012 A1 Mar. 25, 2010

(30) Foreign Application Priority Data

Sep. 22, 2008 (KR) .................. 10-2008-0092920

(51) Int. Cl.
*G11C 16/04* (2006.01)
(52) U.S. Cl. .......... 365/185.03; 365/185.09; 365/185.12
(58) Field of Classification Search ............. 365/185.03, 365/185.09, 185.12, 185.18; 711/154, 206
See application file for complete search history.

(56) References Cited

U.S. PATENT DOCUMENTS

| 7,299,314 | B2 | 11/2007 | Lin et al. |
| 2005/0180209 | A1 | 8/2005 | Lasser |
| 2007/0086239 | A1 | 4/2007 | Litsyn et al. |
| 2007/0089034 | A1 | 4/2007 | Litsyn et al. |
| 2007/0297265 | A1 | 12/2007 | Kim et al. |
| 2008/0084739 | A1 | 4/2008 | Chae et al. |
| 2008/0162789 | A1 | 7/2008 | Choi et al. |
| 2008/0192539 | A1 | 8/2008 | Choi et al. |
| 2008/0288743 | A1* | 11/2008 | Kim ............................... 711/206 |
| 2009/0073762 | A1* | 3/2009 | Lee et al. ................. 365/185.03 |

(Continued)

FOREIGN PATENT DOCUMENTS

JP 2004-118908 4/2004

(Continued)

OTHER PUBLICATIONS

Edward K. Lee, et al., "RAID: High Performance, Reliable Secondary Storage", ACM Computing Surveys, Jun. 1994, vol. 26, Issue 2, pp. 145-185.

(Continued)

*Primary Examiner* — VanThu Nguyen
*Assistant Examiner* — Hien N Nguyen
(74) *Attorney, Agent, or Firm* — Staas & Halsey LLP

(57) ABSTRACT

A Least Significant Bit (LSB) page recovery method used in a multi-level cell (MLC) flash memory device includes setting first through $n^{th}$ LSB page groups (n being a natural number that is larger than 2) comprising at least two LSB pages from among the LSB pages included in the MLC flash memory, programming the first through $x^{th}$ LSB pages (x is a natural number that is larger than 2) included in an $i^{th}$ LSB page group (i is a natural number that is smaller than n), generating and storing an $i^{th}$ LSB parity page for the first through $x^{th}$ LSB pages, programming first through $x^{th}$ MSB pages which correspond to one LSB page from among the first through $x^{th}$ LSB pages, and recovering a $j^{th}$ LSB page, which are paired with a $j^{th}$ MSB page, using the $i^{th}$ LSB parity page corresponding to the $i^{th}$ LSB page group, when a power supply to the MLC flash memory is stopped during the programming of the $j^{th}$ MSB page (j is a natural number that is smaller than x).

20 Claims, 4 Drawing Sheets

U.S. PATENT DOCUMENTS

2010/0235715 A1 * 9/2010 Thatcher et al. ............ 714/763

FOREIGN PATENT DOCUMENTS

| JP | 2006-294126 | 10/2006 |
|----|-------------|---------|
| JP | 2007-048410 | 2/2007 |
| JP | 2007-257109 | 10/2007 |
| JP | 2008-003684 | 1/2008 |
| KR | 10-0736103 | 6/2007 |
| KR | 10-0771882 | 10/2007 |
| KR | 10-0799688 | 1/2008 |

OTHER PUBLICATIONS

International Search Report issued May 25, 2010 in corresponding International Patent Application PCT/KR2009/005359.

* cited by examiner

|  | ① | ② |
|---|---|---|
| MSB | 1 | 1 |
| LSB | 1 | 0 |

|  | ① | ② |
|---|---|---|
| MSB | 1 | 0 |
| LSB | 1 | 1 |

|  | ① | ② |
|---|---|---|
| MSB | 1 | 0 |
| LSB | 0 | 0 |

Paired page

LEAST SIGNIFICANT BIT PAGE RECOVERY METHOD USED IN MULTI-LEVEL CELL FLASH MEMORY DEVICE

CROSS-REFERENCE TO RELATED APPLICATIONS

This application claims the benefit of Korean Patent Application No. 10-2008-0092920, filed on Sep. 22, 2008, in the Korean Intellectual Property Office, the disclosure of which is incorporated herein in its entirety by reference.

BACKGROUND

1. Field

One or more embodiments relate to semiconductor memory devices, and more particularly, to a Least Significant Bit (LSB) page recovery method used in a multi-level cell (MLC) flash memory device, the method including setting LSB page groups and generating LSB parity for the LSB page groups, so that the LSB page is easily recovered even if a power supply is stopped during the execution of a program for a Most Significant Bit (MSB) page.

2. Description of the Related Art

In a Multi Level Cell (MLC) flash memory, two or more bits are programmed in one cell. Among the bits, a lower bit is denoted as the Least Significant Bit (LSB) and an upper bit is denoted as the Most Significant Bit (MSB).

SUMMARY

One or more embodiments include a Least Significant Bit (LSB) page recovery method used in a multi-level cell flash memory device, such that the LSB page is easily recovered even if power supply is stopped during the execution of a program for a Most Significant Bit (MSB) page.

Additional aspects will be set forth in part in the description which follows and, in part, will be apparent from the description, or may be learned by practice of the invention.

To achieve the above and/or other aspects, one or more embodiments may include a Least Significant Bit (LSB) page recovery method used in a multi-level cell (MLC) flash memory in which LSB pages and Most Significant Bit (MSB) pages are paired with each other in a paired page structure and are programmed or read, the method including setting first through nth LSB page groups (n being a natural number that is larger than 2) comprising at least two LSB pages from among the LSB pages included in the MLC flash memory, programming first through xth LSB pages (x being a natural number that is larger than 2) included in an ith LSB page group (i being a natural number that is smaller than n), generating and storing an ith LSB parity page for the first through xth LSB pages, programming first through xth MSB pages which correspond to one LSB page from among the first through xth LSB pages, and recovering a jth LSB page, paired with a jth MSB page, using the ith LSB parity page corresponding to the ith LSB page group, when a power supply to the MLC flash memory is stopped during the programming of the jth MSB page (j being a natural number that is smaller than x).

The ith LSB parity page and the ith LSB page group may be located in the same block, from among blocks of the MLC flash memory. Also, the ith LSB parity page and the ith LSB page group may be located in different blocks, from among blocks of the MLC flash memory.

The ith LSB parity page may be located in a memory that is different from the MLC flash memory. Here, the memory, to which the ith LSB parity page is located, may be a non-volatile memory.

When the LSB page group which is located close to the ith LSB page group is an (i+1)th page group, the (i+1)th page group may include a (x+1)th LSB page through (2x+1)th LSB pages, wherein the (x+1)th LSB page is located closest to the ith page group and a (x+2)th through the (2x+1)th LSB pages are located between the (x+1)th LSB page and a (x+1)th MSB page, which corresponds to the (x+1)th LSB page.

When programming of the first through xth MSB pages is completed, the method may then further include programming the (x+1)th LSB page through (2x+1)th LSB pages included in the (i+1)th LSB page group and generating an (i+1)th LSB parity page for the (x+1)th LSB page through (2x+1)th LSB pages, and recovering the corresponding LSB page using the (i+1)th LSB parity page, when a power supply to the MLC flash memory is stopped during the programming of the (x+1)th through (2x+1)th MSB pages, which correspond to the (x+1)th LSB page through (2x+1)th LSB pages.

In the paired page structure in the MLC flash memory, an arbitrary LSB page may be paired with an MSB page, which is spaced apart from the arbitrary LSB page by four pages. Also, in the paired page structure in the MLC flash memory, arbitrary LSB pages may be paired with MSB pages, which are spaced apart from the arbitrary LSB pages by four pages, when the arbitrary LSB pages are the first two LSB pages and the last two LSB pages from among the LSB pages, and the arbitrary LSB pages are paired with the MSB pages, which are spaced apart from the arbitrary LSB pages by six pages, when the arbitrary LSB pages are not the first two LSB pages and the last two LSB pages from among the LSB pages.

The MLC flash memory may be a 2-bit MLC flash memory. Here, the ith LSB parity page may be generated by performing an exclusive OR (XOR) operation on the first through xth LSB pages. Also, in the recovering of the jth LSB page, an XOR operation may be performed on the ith LSB parity page and the LSB pages, except for the jth LSB page, from among the first through xth LSB pages.

The MLC flash memory may be an n-bit MLC flash memory (n being a natural number of 3 or more). Here, the ith LSB page group may include sub-LSB page groups comprising at least two LSB pages from among the first through xth LSB pages, the number of sub-LSB page groups corresponding to n.

In addition, the ith LSB parity page may be generated for each sub-LSB page group.

The ith LSB parity page may be generated by performing an XOR operation on the LSB pages included in correspondence to the sub LSB page groups. In the recovering of the jth LSB page, an XOR operation may be performed on the corresponding ith LSB parity page and the LSB pages, the ith LSB parity page corresponding to the sub-LSB page groups including the jth LSB page and the LSB pages excluding the jth LSB page from among the LSB pages in the sub-LSB page group comprising the jth LSB page.

The MLC flash memory may be a NAND flash memory.

To achieve the above and/or other aspects, one or more embodiments may include a programming method used in an MLC flash memory device and in which LSB pages and MSB pages are paired with each other in a paired page structure and are programmed or read, the method including setting first through nth LSB page groups (n is being a natural number that is larger than 2) comprising at least two LSB pages from among the LSB pages included in the MLC flash memory, programming the first through xth LSB pages (x is being a natural number that is larger than 2) included in an ith LSB page group (i is being a natural number that is smaller than n), generating and storing an ith LSB parity page for the first through xth LSB pages, programming first through xth MSB pages which correspond to one LSB page from among the first through xth LSB pages, and recovering a jth LSB page, which are paired with a jth MSB page, using the ith LSB parity page corresponding to the ith LSB page group, when a power supply to the MLC flash memory is stopped during the programming of the jth MSB page (j is being a natural number that is smaller than x).

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION OF EMBODIMENTS

Figures 1, 2A, 2B:
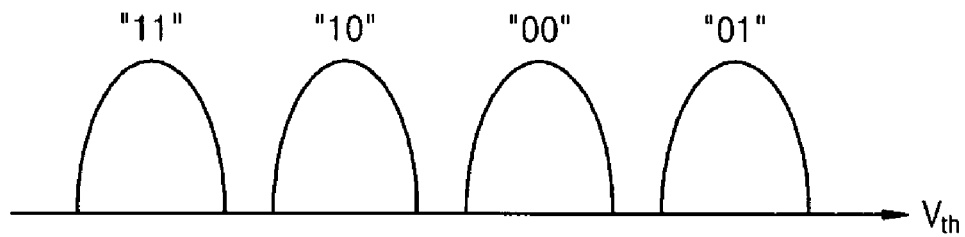
FIG. 1 illustrates cell threshold voltage distributions in a 2-bit Multi Level Cell (MLC) flash memory.
FIGS. 2A and 2B illustrate programming processes in a 2-bit MLC flash memory, for example, the 2-bit MLC flash memory of FIG. 1.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

In a Multi Level Cell (MLC) flash memory, two bits (or more than two) are programmed in one cell. Among the bits, a lower bit is denoted as the Least Significant Bit (LSB) and an upper bit is denoted as the Most Significant Bit (MSB). Both the LSB and the MSB are in the same cells included in a same wordline on a cell array. However, since the LSB and the MSB form two different pages, the LSB and the MSB are respectively programmed by their respective page addresses.

An LSB page is for recording or reading a lower bit and an MSB page is for recording or reading an upper bit. One or more embodiments may be applied to the MLC flash memory, which includes a cell programmed with two or more bits. However, for the convenience of description, hereinafter, a case where one cell in an MLC flash memory represents two bit values is described. In addition, the flash memory described below may be a NAND flash memory.

FIG. 1 illustrates cell threshold voltage distributions in a 2-bit MLC flash memory.

Referring to FIG. 1, each memory cell of the 2-bit MLC flash memory represents any one value from among "11", "10", "00" and "01", according to the intensity of a cell threshold voltage. As such, when the 2-bit MLC flash memory represents two bits, at least two programming processes are required.

FIGS. 2A and 2B illustrate the programming processes in the 2-bit MLC flash memory.

Referring to FIG. 2A, the LSB "1" of a memory cell initialized to "11" (①) is programmed to "0" (②) and thus, the programmed memory cell has a value of "10." Then, as in FIG. 2B, MSB of a memory cell initialized to "11" (①) is programmed to "0" (②) and then, the programmed memory cell has a value of "01." Also, the MSB of a memory cell programmed to "10" (①) is programmed to "0" (②) and then, the programmed memory cell has a value of "00."

Figure 3:
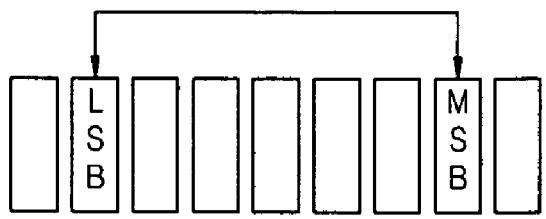
FIG. 3 schematically illustrates a "Paired Page" between a Least Significant Bit (LSB) page and a Most Significant Bit (MSB) page in a 2-bit MLC flash memory, for example, the 2-bit MLC flash memory of FIG. 1.

As such, the LSB and the MSB that are programmed to different pages may be connected by a "Paired Page" illustrated, for example, in FIG. 3.

FIG. 3 schematically illustrates the "Paired Page" between the LSB page and the MSB page in the 2-bit MLC flash memory.

Figure 4:
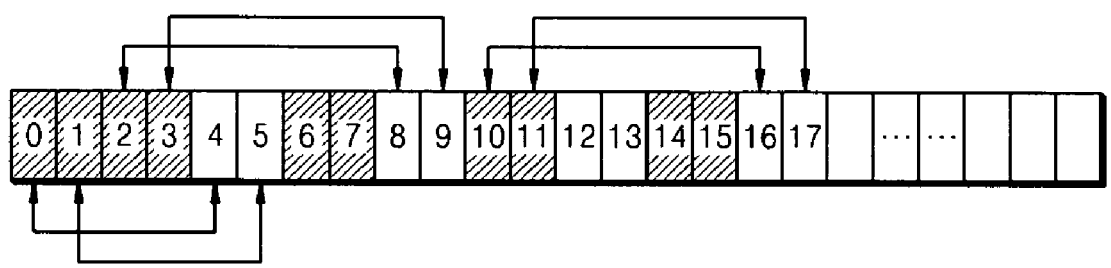
FIG. 4 illustrates an example of a "Paired Page," for example, the "Paired Page" of FIG. 3.

FIG. 4 is an example of a "Paired Page," for example, the "Paired Page" of FIG. 3.

Referring to FIGS. 3 and 4, in the "Paired Page" of FIG. 3, first two LSB pages 0 and 1 and last two LSB pages (not illustrated) may pair with the MSB pages which are spaced apart from the LSB pages by four pages. The rest of the LSB pages 2, 3, 6, 7 . . . may pair with the MSB pages which are spaced apart from the LSB pages by six pages. For example, the LSB page "0" may pair with the MSB page "4" and the LSB page "2" may pair with the MSB page "8."

Figure 5:
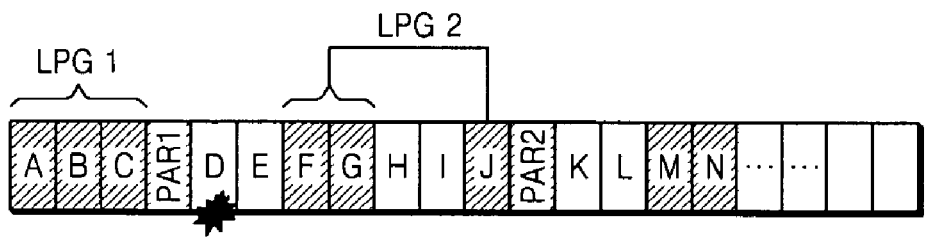
FIG. 5 illustrates locations of LSB parity pages in a "Paired Page," for example, the "Paired Page" of FIG. 4.

FIG. 5 illustrates locations of LSB parity pages in a "Paired Page," for example, the "Paired Page" of FIG. 4.

Referring to FIG. 5, it is assumed that arbitrary numbers of the LSB pages, that are adjacent to each other, are denoted as an LSB page group. Here, a second LSB page group LPG2 is formed of the LSB page "F" located closest to a first LSB page group LPG1 and the LSB pages "G" and "J" existing between the LSB page "F" and the MSB page "K", which pairs with the LSB page "F".

The LSB parity pages for the LSB pages included in each LSB page group exist. For example, the LSB parity page "PAR1" exists for the three LSB pages "A", "B" and "C" included in the first LSB page group LPG1. Here, the LSB parity page "PAR1" may be realized using information generating methods used in a method of generating a parity (a Redundant Array of Independent/Inexpensive Disks (RAID) technique), the parity being generated for the three LSB pages "A", "B" and "C".

Hereinafter, for the convenience of description, only a case where the LSB parity page "PAR1" performs an exclusive OR (XOR) operation and generates the three LSB pages "A", "B" and "C" is described. For example, the LSB parity page "PAR1" sequentially performs an XOR operation for "0", "1" and "1" with respect to the LSB pages "A", "B" and "C" respectively programmed to "0", "1" and "1" and may have a value of "0".

In FIG. 5, a power supply is suddenly stopped during the programming of the MSB page "D." In this case, a programmed state of the LSB page "A" corresponding to the MSB page "D" may not be ensured. In the 2-bit MLC flash memory, the LSB pages and the MSB pages that are related to each other share the same word line so that if the program of an MSB page is not properly completed due to a sudden power off, a programmed state of an LSB page is not ensured.

For example, when a power supply is stopped while the LSB "1" is programmed so as to be "01" and then the MSB "0" is programmed, the cell potential of the LSB page that is programmed to "1" may be changed. In this case, the LSB may be recognized as "0", instead of "1".

In the 2-bit MLC flash memory according to the current embodiment, the LSB parity page is referred to and the LSB page is recovered. When a power supply is stopped during the programming of the MSB page "D", an XOR operation is sequentially performed to the LSB parity page "PAR1" and the LSB pages "C" and "B" and then, the LSB page "A" may be recovered. For example, the LSB page "A" may be recovered using "1" obtained by performing an XOR operation on the LSB parity page "PAR1" with a value of "0" and the LSB page "C" with a value of "1" and using the value of "0" obtained by performing an XOR operation on the LSB page "B" with a value of "1".

As such, even if the power supply is stopped during the programming of the MSB page, the 2-bit MLC flash memory device according to one or more embodiments may easily recover the LSB page.

Figure 6:
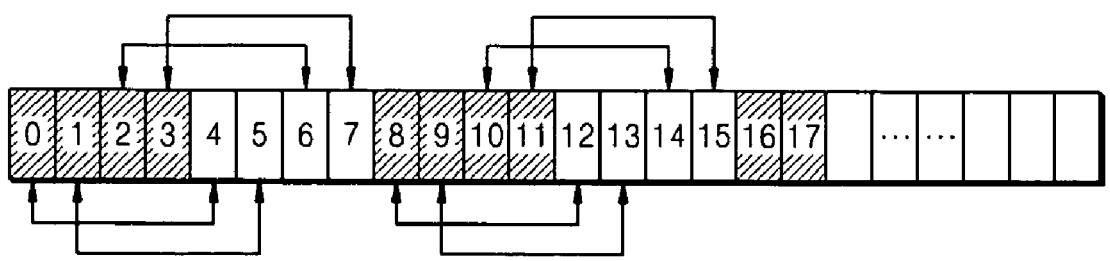
FIG. 6 illustrates another example of a "Paired Page," for example, of FIG. 3.

FIG. 6 illustrates another example of the "Paired Page," for example, of FIG. 3.

Referring to FIGS. 3 and 6, unlike FIG. 4, all LSB pages may be paired with the MSB pages which are spaced apart from the LSB pages by four pages, in FIG. 6. For example, the LSB page "0" may be paired with the MSB page "4" and the LSB page "2" may be paired with the MSB page "6".

Figure 7:
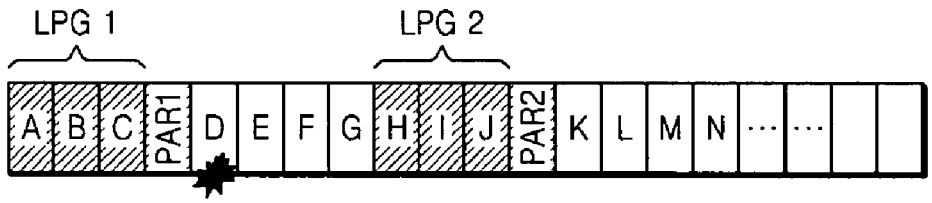
FIG. 7 illustrates locations of LSB parity pages in a "Paired Page," for example, the "Paired Page" of FIG. 6.

FIG. 7 illustrates locations of the LSB parity pages in a "Paired Page," for example, the "Paired Page" of FIG. 6.

Referring to FIG. 7, an LSB parity page "PAR1" exists for LSB pages "A", "B" and "C" included in a first LSB page group LPG1 and an LSB parity page PAR2 exists for LSB pages "H", "I" and "J" included in a second LSB page group LPG2. The configuration of FIG. 7 is similar to that of FIG. 5, except for the configuration of an LSB page group, and thus, its detailed description is omitted.

Figure 8:
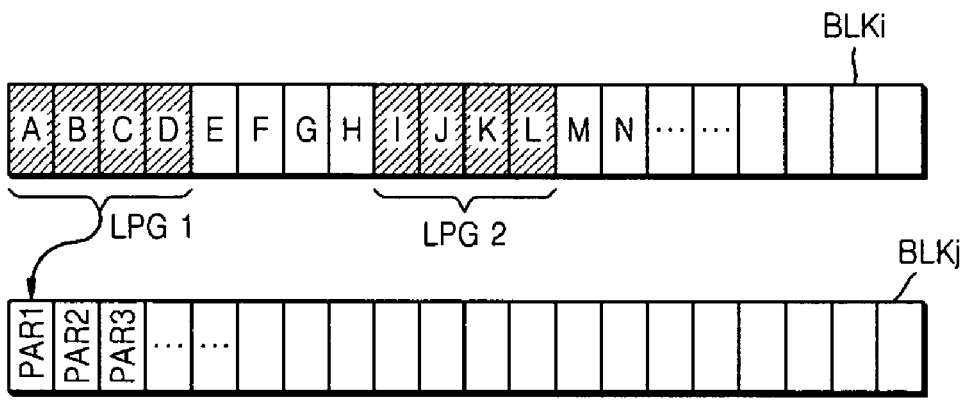
FIG. 8 illustrates LSB parity pages and LSB pages located in different blocks.

In the 2-bit MLC flash memory described with reference to FIGS. 5 and 7, an LSB parity page is located in the same block with LSB pages; however, one or more embodiments are not limited thereto and the LSB parity pages PAR1, PAR2, PAR3, etc., may be located in a block BLKj that is different from a block BLKi to which the LSB pages A, B, C, etc., are located, as in FIG. 8, where i and j are natural numbers.

Figure 9:
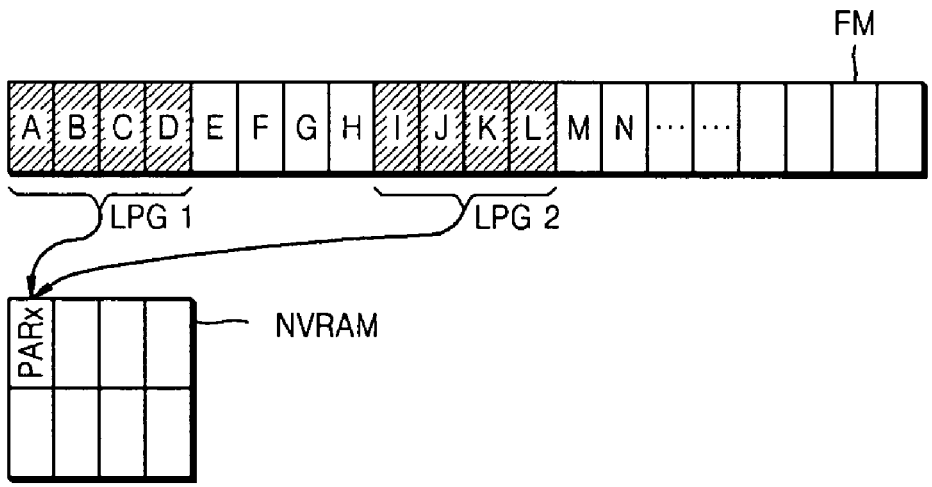
FIG. 9 illustrates LSB parity pages and LSB pages located in different memories.

In addition, as illustrated in FIG. 9, an LSB parity page PARx may be located in a memory NVRAM that is different from a memory FM to which LSB pages A, B, C, etc., are located, where x is a natural number. In particular, since LSB parity pages are stored in a non-volatile memory, the memory capacity consumed by the LSB parity pages may be reduced.

When programming for the MSB pages, which correspond to an arbitrary LSB page group, is not properly completed, the LSB parity page for the corresponding LSB page group is not functional. However, in a non-volatile memory, an in-place update function is provided so that a new LSB parity page may be recovered on the location to which the LSB parity page is stored.

As described above, an LSB page recovering method used in the 2-bit MLC flash memory has been described. Hereinafter, an LSB page recovery method used in a 3-bit MLC flash memory will be described.

Figure 10:
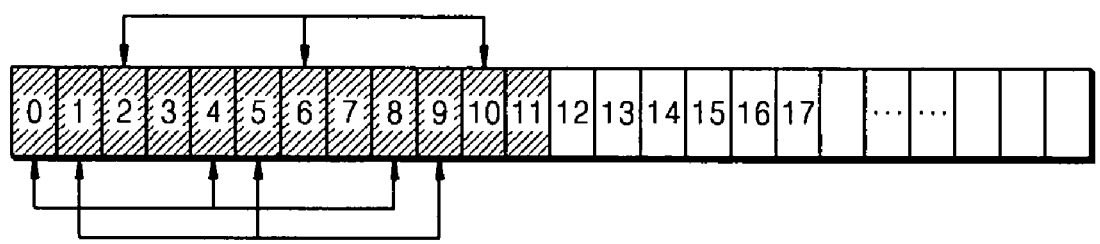
FIG. 10 illustrates "Paired Pages" between LSB pages and MSB pages in a 3-bit MLC flash memory.

FIG. 10 illustrates a "Paired Pages" between LSB pages and MSB pages in the 3-bit MLC flash memory.

Referring to FIG. 10, LSB pages "0" and "4" are paired with the MSB page "8" and LSB pages "1" and "5" are paired with the MSB page "9". The rest of the LSB pages are paired with the rest of the MSB pages in the same manner, thereby indicating a cell value of 3 bits.

Figure 11:
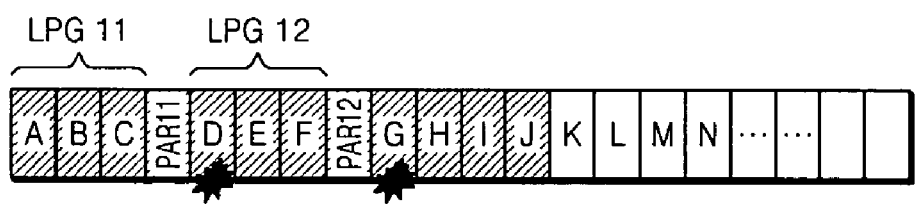
FIG. 11 illustrates locations of LSB parity pages in "Paired Pages," for example, the "Paired Pages" of FIG. 10.

FIG. 11 illustrates locations of LSB parity pages in "Paired Pages," for example, the "Paired Pages" of FIG. 10.

Referring to FIG. 11, an LSB parity page exists for an LSB page group, as in FIG. 5. However, in the 3-bit MLC flash memory, an LSB is 2 bits so that the LSB page groups, which correspond to each bit, are required. For example, as illustrated in FIG. 11, an eleventh LSB page group LPG11 and a twelfth LSB page group LPG12 for one of the bits of the LSB exist.

Here, the LSB parity page exists for each bit of the LSB. An eleventh LSB parity page PAR 11 for the eleventh LSG page group LPG11 and a twelfth LSB parity page PAR 12 for the twelfth LSB parity group LPG 12 may exist.

When programming for LSB pages "A", "B" and "C" included in the eleventh LSG page group LPG11 is completed and when a power supply to the 3-bit MLC flash memory is stopped during the programming of the LSB page "D" included in the twelfth LSB parity group LPG 12, the LSB page "A" may be recovered by the method as described with reference to FIG. 5. That is, an XOR operation is sequentially performed on the eleventh LSB parity page PAR 11, and the LSB pages "C" and "B" and thus, the LSB page "A" may be recovered.

Similarly, when programming LSB pages "D", "E" and "F" included in the twelfth LSB parity group LPG 12 is completed and when a power supply is stopped during the programming of the MSB page "G", the LSB page "A" is recovered by the method described above, and an XOR operation is sequentially performed for the twelfth LSB parity page PAR 12 and the LSB pages "F" and "E", thereby recovering the LSB page "D".

As described above, the LSB recovery method according to one or more embodiments may be also applied to the MLC flash memory which includes a cell programmed with 3-bit or more than 3-bit.

As described above, according to the one or more of the above embodiments, the LSB page can be easily recovered even if power supply is stopped during the programming of the MSB pages.

In addition to the above described embodiments, one or more embodiments may also be implemented through computer readable code/instructions in/on a medium, e.g., a computer readable medium, to control at least one processing element to implement any above described embodiment. The medium can correspond to any medium/media permitting the storing or transmission of the computer readable code.

The computer readable code can be recorded/transferred on a medium in a variety of ways, with examples of the medium including recording media, such as magnetic storage media (e.g., ROM, floppy disks, hard disks, etc.) and optical recording media (e.g., CD-ROMs, or DVDs), and transmission media. Thus, the medium may be such a defined and measurable structure including or carrying a signal or information, such as a device carrying a bitstream, for example, according to one or more embodiments. The media may also be a distributed network, so that the computer readable code is stored/transferred and executed in a distributed fashion. Still further, as only an example, the processing element could include a processor or a computer processor, and processing elements may be distributed and/or included in a single device.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A Least Significant Bit (LSB) page recovery method used in a multi-level cell (MLC) flash memory, in which LSB pages and Most Significant Bit (MSB) pages are paired with each other in a paired page structure and are programmed or read, the method comprising:

setting first through $n^{th}$ LSB page groups (n being a natural number that is larger than 2) comprising at least two LSB pages from among the LSB pages included in the MLC flash memory;

programming first through $x^{th}$ LSB pages (x being a natural number that is larger than 2) included in an $i^{th}$ LSB page group (i being a natural number that is smaller than n);

generating and storing an $i^{th}$ LSB parity page for the first through $x^{th}$ LSB pages;

programming first through $x^{th}$ MSB pages which correspond to one LSB page from among the first through $x^{th}$ LSB pages; and recovering a $j^{th}$ LSB page, paired with a $j^{th}$ MSB page, using the $i^{th}$ LSB parity page corresponding to the $i^{th}$ LSB page group, when a power supply to the MLC flash memory is stopped during the programming of the $j^{th}$ MSB page (j being a natural number that is smaller than x).

2. The method of claim 1, wherein the $i^{th}$ LSB parity page and the $i^{th}$ LSB page group are located in the same block, from among blocks of the MLC flash memory.

3. The method of claim 1, wherein the $i^{th}$ LSB parity page and the $i^{th}$ LSB page group are located in different blocks, from among blocks of the MLC flash memory.

4. The method of claim 1, wherein the $i^{th}$ LSB parity page is located in a memory that is different from the MLC flash memory.

5. The method of claim 4, wherein the memory, to which the $i^{th}$ LSB parity page is located, is a non-volatile memory.

6. The method of claim 1, wherein when an LSB page group located close to the $i^{th}$ LSB page group is an $(i+1)^{th}$ page group, the $(i+1)^{th}$ page group comprises a $(x+1)^{th}$ LSB page through $(2x+1)^{th}$ LSB pages, wherein the $(x+1)^{th}$ LSB page is located closest to the $i^{th}$ page group and a $(x+2)^{th}$ through the $(2x+1)^{th}$ LSB pages are located between the $(x+1)^{th}$ LSB page and a $(x+1)^{th}$ MSB page, which corresponds to the $(x+1)^{th}$ LSB page.

7. The method of claim 6, further comprising:

programming the $(x+1)^{th}$ LSB page through $(2x+1)^{th}$ LSB pages included in the $(i+1)^{th}$ LSB page group and generating an $(i+1)^{th}$ LSB parity page for the $(x+1)^{th}$ LSB page through $(2x+1)^{th}$ LSB pages, upon the programming of the first through $x^{th}$ MSB pages being completed; and recovering the corresponding LSB page using the $(i+1)^{th}$ LSB parity page, when a power supply to the MLC flash memory is stopped during the programming of the $(x+1)^{th}$ through $(2x+1)^{th}$ MSB pages, which correspond to the $(x+1)^{th}$ LSB page through $(2x+1)^{th}$ LSB pages.

8. The method of claim 1, wherein in the paired page structure in the MLC flash memory, an arbitrary LSB page is paired with an MSB page, which is spaced apart from the arbitrary LSB page by four pages.

9. The method of claim 1, wherein in the paired page structure in the MLC flash memory, arbitrary LSB pages are paired with MSB pages, which are spaced apart from the arbitrary LSB pages by four pages, when the arbitrary LSB pages are the first two LSB pages and the last two LSB pages from among the LSB pages, and the arbitrary LSB pages are paired with the MSB pages, which are spaced apart from the arbitrary LSB pages by six pages, when the arbitrary LSB pages are not the first two LSB pages and the last two LSB pages from among the LSB pages.

10. The method of claim 1, wherein the MLC flash memory is a 2-bit MLC flash memory.

11. The method of claim 10, wherein the $i^{th}$ LSB parity page is generated by performing an exclusive OR (XOR) operation on the first through $x^{th}$ LSB pages.

12. The method of claim 11, wherein in the recovering of the $j^{th}$ LSB page, an XOR operation is performed on the $i^{th}$ LSB parity page and the first through $x^{th}$ LSB pages, except for the $j^{th}$ LSB page, from among the first through $x^{th}$ LSB pages.

13. The method of claim 1, wherein the MLC flash memory is an n-bit MLC flash memory (n being a natural number of 3 or more).

14. The method of claim 13, wherein the $i^{th}$ LSB page group comprises sub-LSB page groups comprising at least two LSB pages from among the first through $x^{th}$ LSB pages, the number of sub-LSB page groups corresponding to n.

15. The method of claim 14, wherein the $i^{th}$ LSB parity page is generated for each sub-LSB page group.

16. The method of claim 15, wherein the $i^{th}$ LSB parity page is generated by performing an XOR operation on the at least two LSB pages included in correspondence to the sub-LSB page groups.

17. The method of claim 16, wherein in the recovering of the $j^{th}$ LSB page, an XOR operation is performed on a corresponding $i^{th}$ LSB parity page and LSB pages, the corresponding $i^{th}$ LSB parity page corresponding to the sub-LSB page groups comprising the $j^{th}$ LSB page and the LSB pages excluding the $j^{th}$ LSB page from among LSB pages in the sub-LSB page group comprising the $j^{th}$ LSB page.

18. The method of claim 1, wherein the MLC flash memory is a NAND flash memory.

19. A programming method used in a multi-level cell (MLC) flash memory device and in which Least Significant Bit (LSB) pages and Most Significant Bit (MSB) pages are paired with each other in a paired page structure and are programmed or read, the method comprising:

setting first through $n^{th}$ LSB page groups (n being a natural number that is larger than 2) comprising at least two LSB pages from among the LSB pages included in the MLC flash memory;

programming first through $x^{th}$ LSB pages (x being a natural number that is larger than 2) included in an $i^{th}$ LSB page group (i being a natural number that is smaller than n);

generating and storing an $i^{th}$ LSB parity page for the first through $x^{th}$ LSB pages;

programming first through $x^{th}$ MSB pages which correspond to one LSB page from among the first through $x^{th}$ LSB pages; and recovering a $j^{th}$ LSB page, paired with a $j^{th}$ MSB page, using the $i^{th}$ LSB parity page corresponding to the $i^{th}$ LSB page group, when a power supply to the MLC flash memory is stopped during the programming of the $j^{th}$ MSB page (j being a natural number that is smaller than x).

20. A multi-level cell (MLC) flash memory device using the Least Significant Bit (LSB) page recovery method of claim 1.

* * * * *